(12) United States Patent
Cho et al.

(10) Patent No.: US 10,332,825 B2
(45) Date of Patent: *Jun. 25, 2019

(54) SEMICONDUCTOR PACKAGE INCLUDING FLIP CHIP MOUNTED IC AND VERTICALLY INTEGRATED INDUCTOR

(71) Applicant: Infineon Technologies Americas Corp., El Segundo, CA (US)

(72) Inventors: Eung San Cho, Torrance, CA (US); Parviz Parto, Laguna Niguel, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 50 days.

This patent is subject to a terminal disclaimer.

(21) Appl. No.: 15/161,077

(22) Filed: May 20, 2016

(65) Prior Publication Data

US 2017/0338171 A1  Nov. 23, 2017

(51) Int. Cl.
*H01L 21/48* (2006.01)
*H01L 23/00* (2006.01)
(Continued)

(52) U.S. Cl.
CPC .... *H01L 23/49575* (2013.01); *H01L 21/4853* (2013.01); *H01L 23/495* (2013.01);
(Continued)

(58) Field of Classification Search
CPC ......... H01L 23/49575; H01L 23/49534; H01L 28/10; H01L 21/4853; H01L 25/16; H01L 24/17; H01L 2924/10253; H01L 2924/1425; H01L 2924/14; H01L 2924/181; H01L 23/495; H01L 23/49537;
(Continued)

(56) References Cited

U.S. PATENT DOCUMENTS

| 6,930,584 B2 | 8/2005 | Edo et al. |
| 7,268,659 B2* | 9/2007 | Nishio ............... H01F 17/0033 257/E23.009 |

(Continued)

FOREIGN PATENT DOCUMENTS

| CN | 1525631 A | 9/2004 |
| DE | 19908374 A1 | 9/2000 |
| DE | 102017109717 A1 | 11/2017 |

OTHER PUBLICATIONS

U.S. Appl. No. 15/148,248, filed by Eung San Cho, filed May 6, 2016.

(Continued)

*Primary Examiner* — Mohsen Ahmadi
*Assistant Examiner* — Scott E Bauman
(74) *Attorney, Agent, or Firm* — Shumaker & Sieffert, P.A.

(57) ABSTRACT

In one implementation, a semiconductor package includes an integrated circuit (IC) flip chip mounted on a first patterned conductive carrier, a second patterned conductive carrier situated over the IC, and a magnetic material situated over the second patterned conductive carrier. The semiconductor package also includes a third patterned conductive carrier situated over the magnetic material. The second patterned conductive carrier and the third patterned conductive carrier are electrically coupled so as to form windings of an integrated inductor in the semiconductor package.

12 Claims, 11 Drawing Sheets

(51) Int. Cl.
*H01L 25/16* (2006.01)
*H01L 49/02* (2006.01)
*H01L 23/495* (2006.01)
*H01L 23/31* (2006.01)

(52) U.S. Cl.
CPC .. *H01L 23/49534* (2013.01); *H01L 23/49537* (2013.01); *H01L 24/17* (2013.01); *H01L 25/16* (2013.01); *H01L 28/10* (2013.01); *H01L 23/3107* (2013.01); *H01L 23/49551* (2013.01); *H01L 24/13* (2013.01); *H01L 24/14* (2013.01); *H01L 24/16* (2013.01); *H01L 2224/13101* (2013.01); *H01L 2224/16245* (2013.01); *H01L 2924/10253* (2013.01); *H01L 2924/14* (2013.01); *H01L 2924/1425* (2013.01); *H01L 2924/181* (2013.01); *H01L 2924/19042* (2013.01); *H01L 2924/19104* (2013.01)

(58) Field of Classification Search
CPC ........... H01L 23/19042; H01L 23/1425; H01L 23/3107; H01L 23/49551; H01L 24/13; H01L 24/14; H01L 24/16
USPC ........................................ 257/676
See application file for complete search history.

(56) References Cited

U.S. PATENT DOCUMENTS

| | | | | |
|---|---|---|---|---|
| 8,432,017 | B2 * | 4/2013 | Kuo | H01F 5/003 257/531 |
| 9,768,099 | B1 | 9/2017 | Cho et al. | |
| 2002/0097129 | A1 * | 7/2002 | Johnson | H01F 17/0006 336/200 |
| 2007/0074386 | A1 | 4/2007 | Lotfi et al. | |
| 2009/0134964 | A1 | 5/2009 | Hebert et al. | |
| 2010/0212150 | A1 * | 8/2010 | Lotfi | H01L 23/495 29/832 |
| 2011/0298088 | A1 | 12/2011 | Elian et al. | |
| 2012/0181624 | A1 * | 7/2012 | Cho | H01L 23/49524 257/401 |
| 2012/0194148 | A1 * | 8/2012 | Yiu | H02M 3/00 323/271 |
| 2012/0274366 | A1 * | 11/2012 | Briere | H01L 21/8258 327/108 |
| 2012/0299150 | A1 * | 11/2012 | Tang | H01L 23/36 257/531 |
| 2012/0326287 | A1 | 12/2012 | Joshi et al. | |
| 2013/0043940 | A1 | 2/2013 | Hebert et al. | |
| 2013/0077250 | A1 | 3/2013 | Herbsommer et al. | |
| 2013/0307117 | A1 * | 11/2013 | Koduri | H01L 23/495 257/531 |
| 2015/0001599 | A1 | 1/2015 | Cho | |
| 2015/0200156 | A1 * | 7/2015 | Weld | H01L 23/49541 257/531 |

OTHER PUBLICATIONS

Office Action from U.S. Appl. No. 15/148,248, dated Mar. 17, 2017, 14 pp.
Response to Office Action dated Mar. 17, 2017, from U.S. Appl. No. 15/148,248, filed Apr. 28, 2017, 7 pp.
Notice of Allowance from U.S. Appl. No. 15/148,248, dated May 18, 2017, 7 pp.
Office Action, in the German language, from counterpart German Application No. 102017110962.5, dated Dec. 20, 2018, 5 pp.
Office Action, in the Chinese language, from counterpart Chinese Application No. 201710362975.2, dated Mar. 11, 2019, 6 pp.

* cited by examiner

SEMICONDUCTOR PACKAGE INCLUDING FLIP CHIP MOUNTED IC AND VERTICALLY INTEGRATED INDUCTOR

BACKGROUND

Integrated circuits (ICs) are widely utilized in modern electronic applications. For example, a power converter switching stage for use in a voltage regulator may be fabricated and packaged as an IC. Such a power converter switching stage IC typically includes a high side control transistor and a low side synchronous (sync) transistor, as well as driver circuitry designed to drive the control and sync transistors.

In many conventional implementations, a semiconductor package containing the power converter switching stage IC is utilized in combination with an output inductor of the power converter, which is often a relatively large discrete component. Consequently, conventional approaches to implementing a power converter on a printed circuit board (PCB) require PCB area sufficient to accommodate a side-by-side layout including not only the semiconductor package containing the power converter switching stage IC, but also the output inductor for the power converter.

SUMMARY

The present disclosure is directed to a semiconductor package including a flip chip mounted integrated circuit (IC) and vertically integrated inductor, substantially as shown in and/or described in connection with at least one of the figures, and as set forth in the claims.

DETAILED DESCRIPTION

Figure 1:
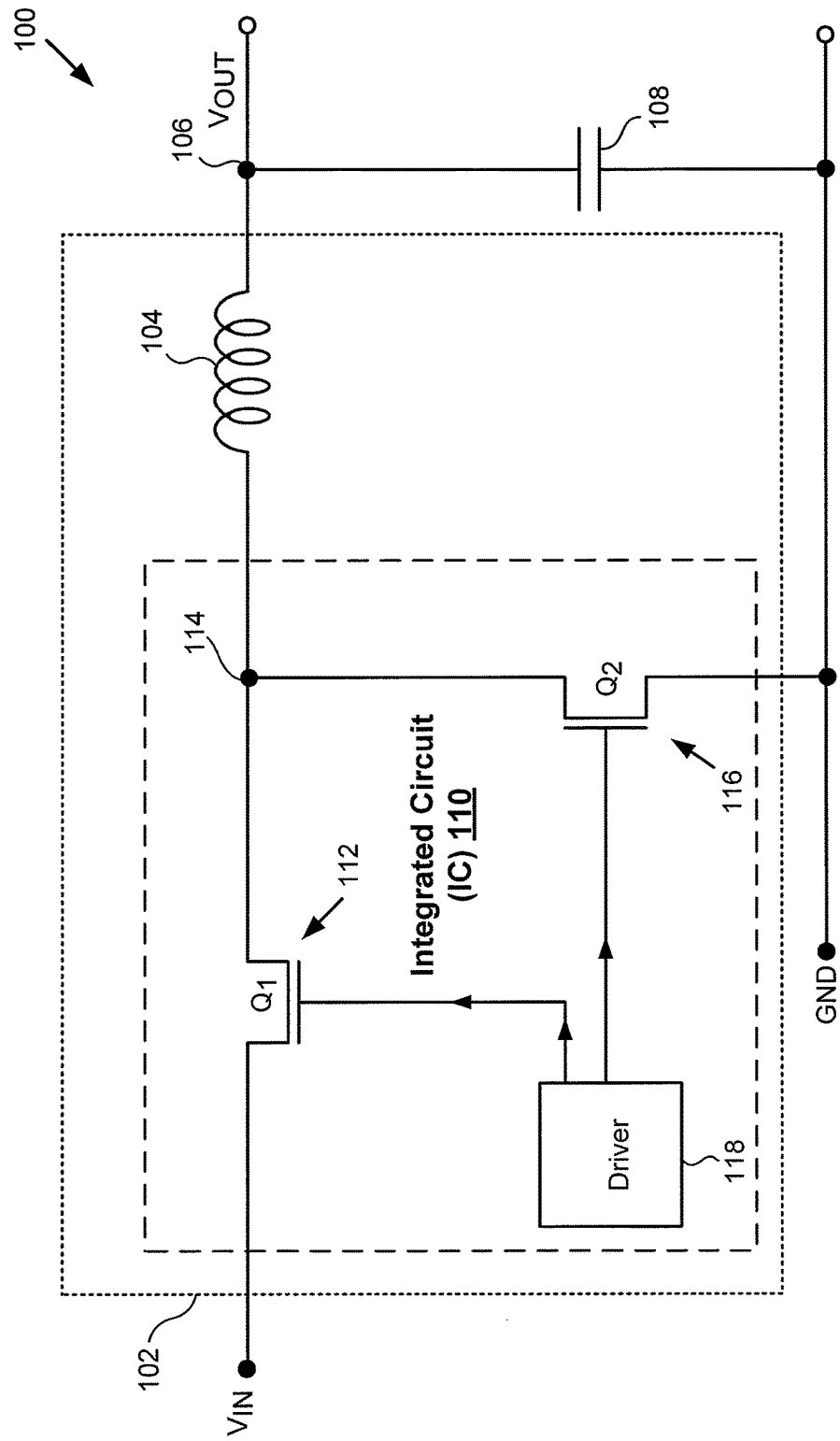
FIG. 1 shows a diagram of an exemplary semiconductor package including an integrated circuit (IC) coupled to an inductor integrated into the semiconductor package, according to one implementation.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As stated above, integrated circuits (ICs) are widely utilized in modern electronic applications. For example, a power converter switching stage for use in a voltage regulator may be fabricated and packaged as an IC. Such a power converter switching stage IC typically includes a high side control transistor and a low side synchronous (sync) transistor, as well as driver circuitry designed to drive the control and sync transistors. As a specific example, a buck converter may include a switching stage IC to convert a higher voltage direct current (DC) input to a lower voltage DC output for use in low voltage applications.

FIG. 1 shows a diagram of a power converter including an exemplary switching stage IC in combination with an output inductor of the power converter, according to one implementation. Power converter 100 includes semiconductor package 102 and output capacitor 108 coupled between output 106 of semiconductor package 102 and ground. As shown in FIG. 1, semiconductor package 102 includes IC 110, which is implemented as a monolithically integrated switching stage of power converter 100, and output inductor 104 of power converter 100 coupled between IC 110 and output 106 of semiconductor package 102. As further shown in FIG. 1, power converter 100 is configured to receive an input voltage $V_{IN}$, and to provide a converted voltage, e.g., a rectified and/or stepped down voltage, as $V_{OUT}$ at output 106.

It is noted that in the interests of ease and conciseness of description, the IC packaging solutions disclosed by the present application will in some instances be described by reference to specific implementations of a power converter, such as the buck converter implementation shown in FIG. 1. However, it is emphasized that such implementations are merely exemplary, and the inventive principles disclosed herein are broadly applicable to a wide range of applications, including not only buck and boost converters, but any application in which co-packaging of an IC and an integrated inductor would be advantageous or desirable.

According to the specific but non-limiting implementation shown in FIG. 1, IC 110 may include two power switches in the form of metal-oxide-semiconductor field-effect transistors (MOSFETs) configured as a half bridge, for example. That is to say, IC 110 may include high side or control FET 112 ($Q_1$) and low side or synchronous (sync)

FET 116 ($Q_2$), as well as driver circuitry 118 for driving control FET 112 and sync FET 116. As further shown in FIG. 1, control FET 112 is coupled to sync FET 116 at switch node 114, which, in turn, is coupled to output 106 of semiconductor package 102 by output inductor 104. As also shown in FIG. 1, output inductor 104 of power converter 100 is integrated into semiconductor package 102, such as by being vertically integrated with IC 110, as described in greater detail below.

Control FET 112 and sync FET 116 may be implemented as group IV based power FETs, such as silicon power MOSFETs having a vertical design, for example. However, it is noted that in some implementations, one or both of control FET 112 and sync FET 116 may take the form of other group IV material based, or group III-V semiconductor based, power transistors.

It is further noted that as used herein, the phrase "group III-V" refers to a compound semiconductor including at least one group III element and at least one group V element. By way of example, a group III-V semiconductor may take the form of a III-Nitride semiconductor that includes nitrogen and at least one group III element. For instance, a III-Nitride power FET may be fabricated using gallium nitride (GaN), in which the group III element or elements include some or a substantial amount of gallium, but may also include other group III elements in addition to gallium. Thus, in some implementations, one or both of control FET 112 and sync FET 116 may take the form of a III-Nitride power FET, such as a III-Nitride high electron mobility transistor (HEMT).

Figure 2:
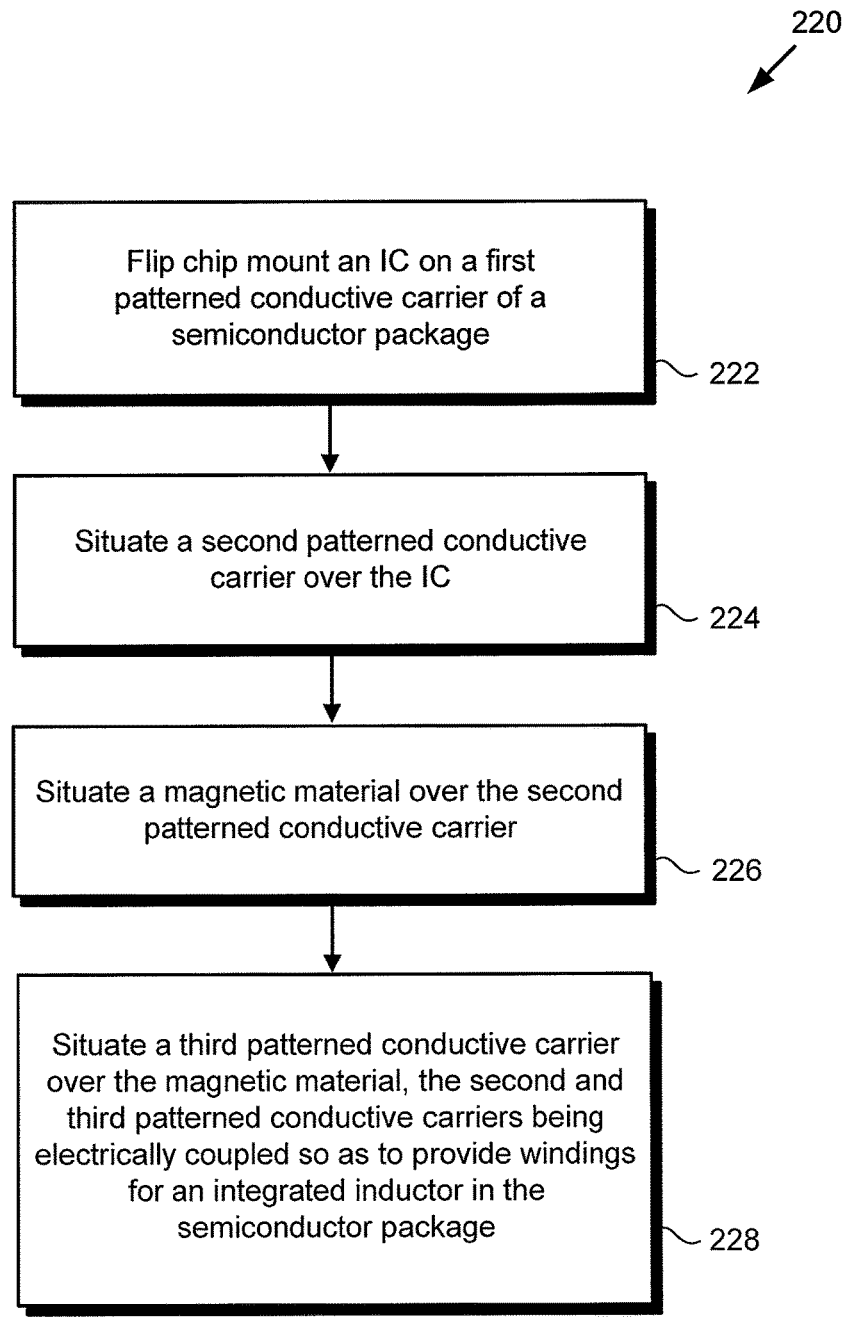
FIG. 2 shows a flowchart presenting an exemplary method for fabricating a semiconductor package including an IC and vertically integrated inductor, according to one implementation.

Continuing to FIG. 2, FIG. 2 shows flowchart 220 presenting an exemplary method for fabricating a semiconductor package including an IC and vertically integrated inductor. The exemplary method described by flowchart 220 is performed on a portion of a conductive carrier structure, which may be a semiconductor package lead frame, or may take the form of a conductive sheet or plate, for example.

Figure 3A:
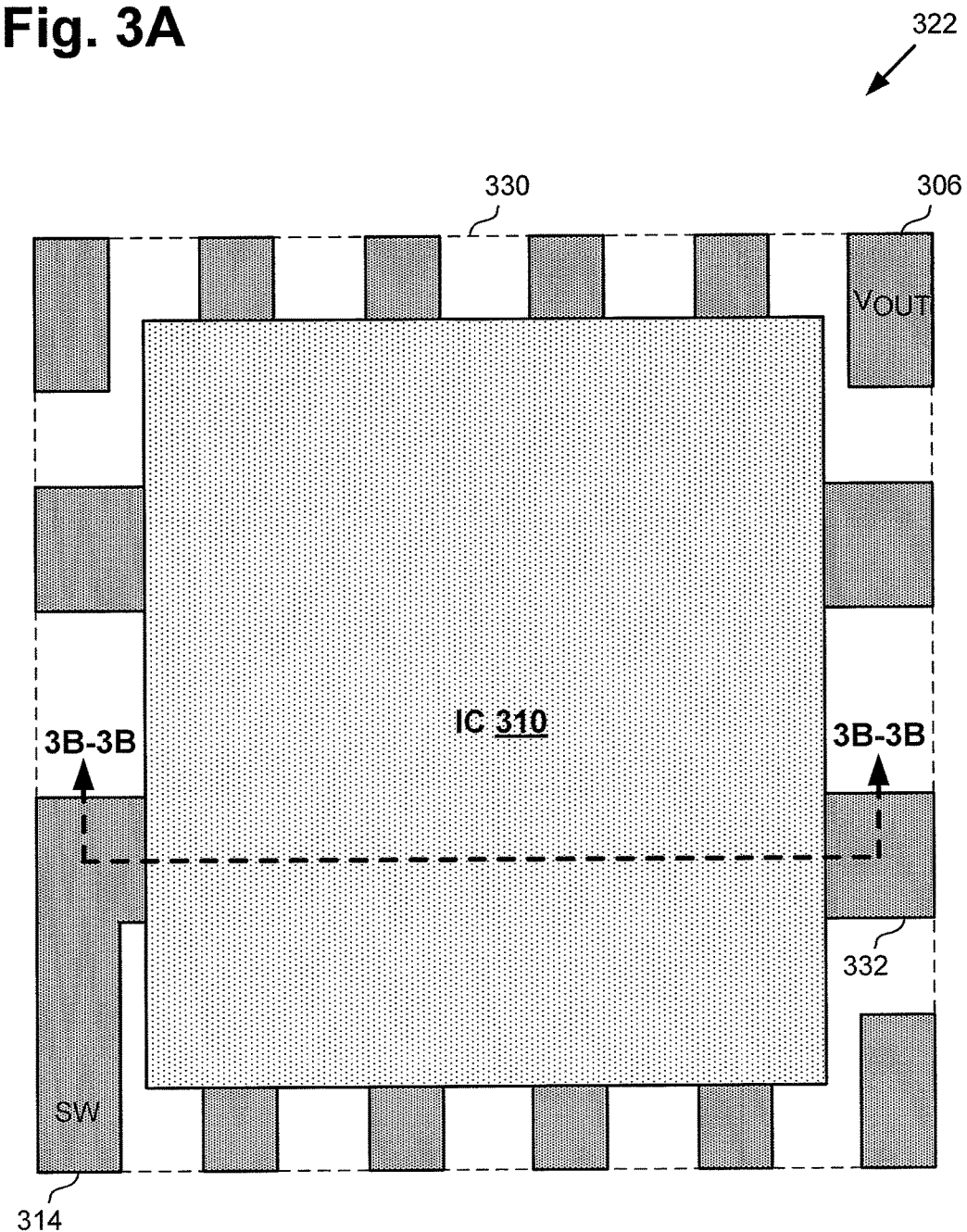
FIG. 3A shows a top view illustrating a result of performing an initial action according to the exemplary flowchart of FIG. 2, in accordance with one implementation.
Figure 3B:
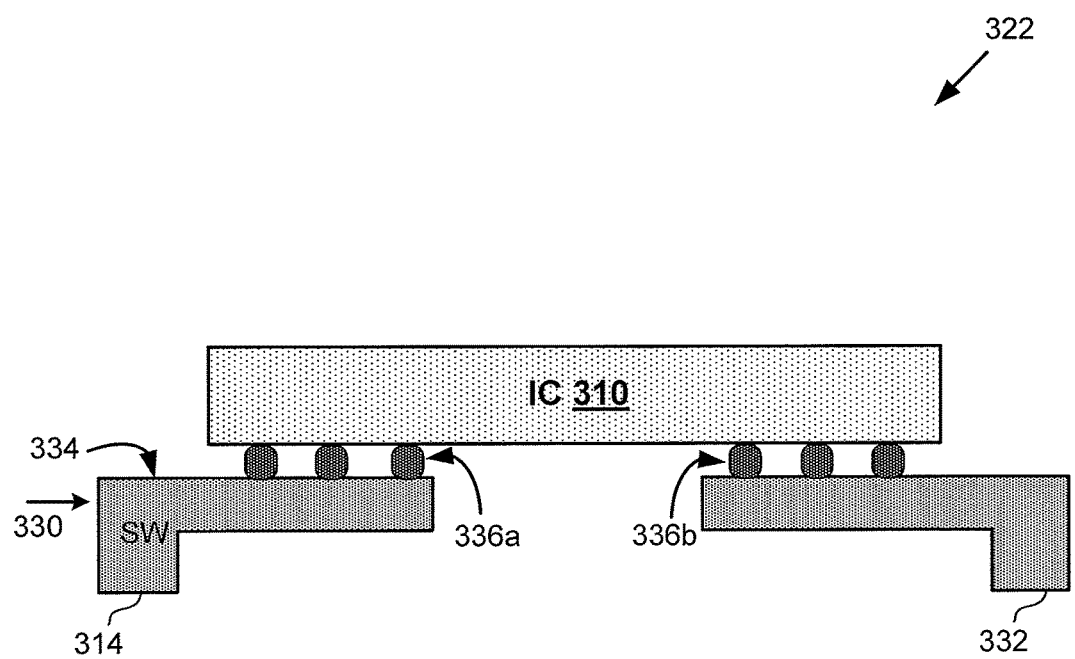
FIG. 3B shows a cross-sectional view of the structure shown in FIG. 3A, in accordance with one implementation.
Figure 3C:
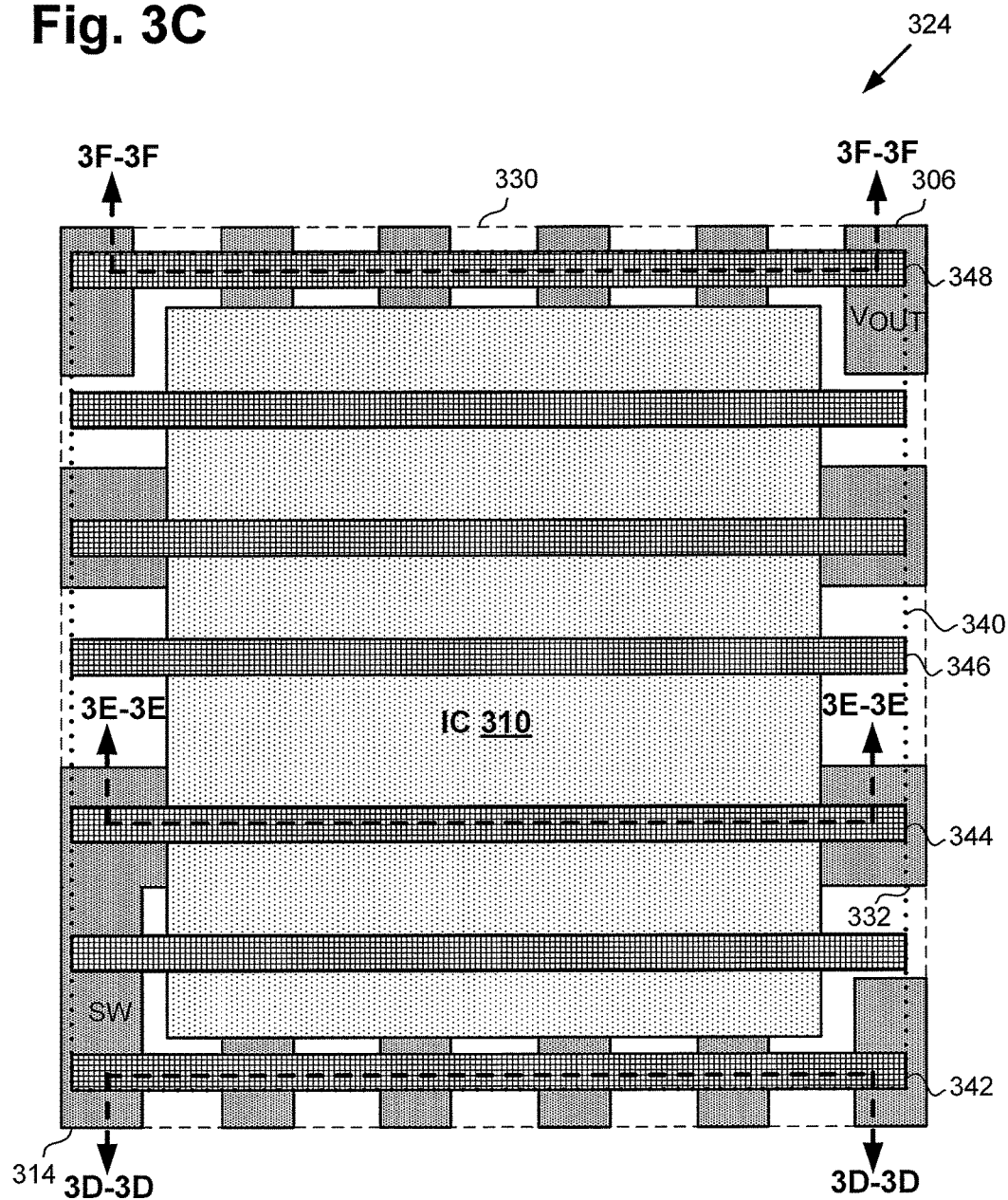
FIG. 3C shows a top view illustrating a result of performing a subsequent action according to the exemplary flowchart of FIG. 2, in accordance with one implementation.
Figure 3D:
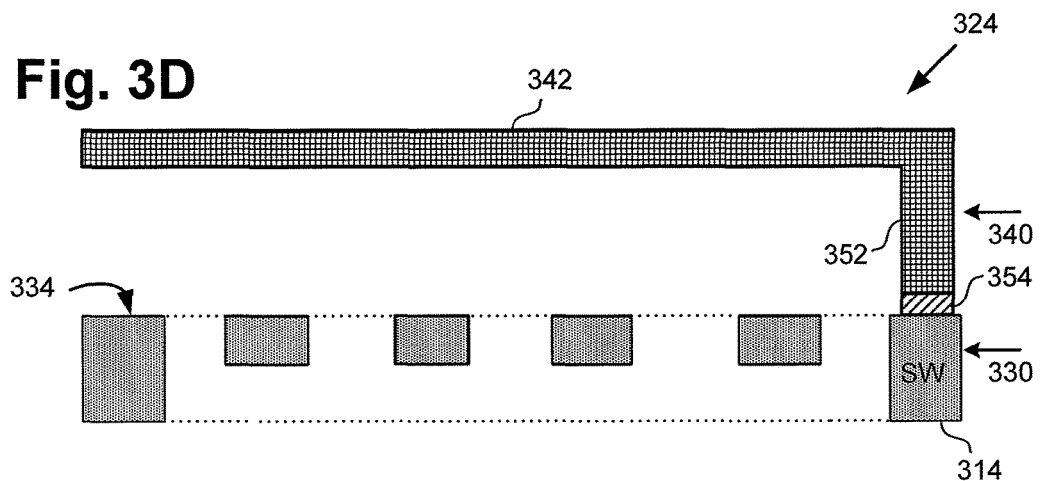
FIG. 3D shows a first cross-sectional view of the structure shown in FIG. 3C, in accordance with one implementation.
Figure 3E:
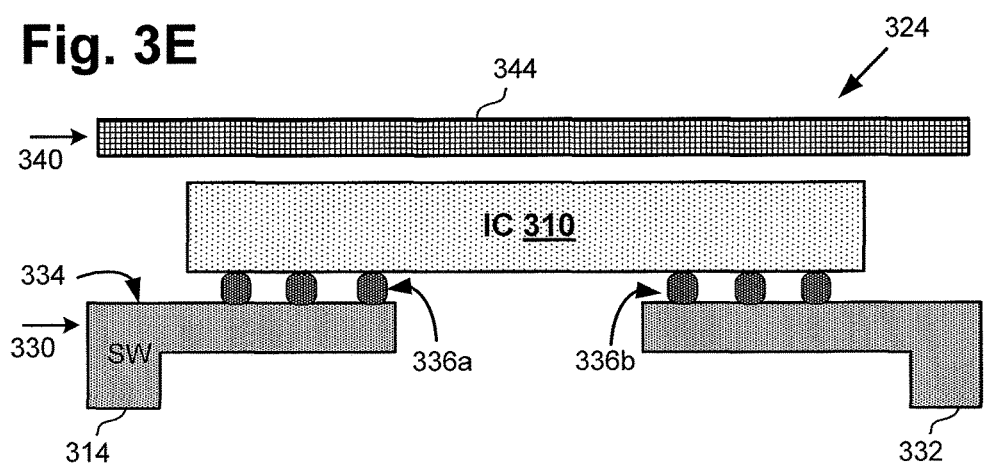
FIG. 3E shows a second cross-sectional view of the structure shown in FIG. 3C, in accordance with one implementation.
Figure 3F:
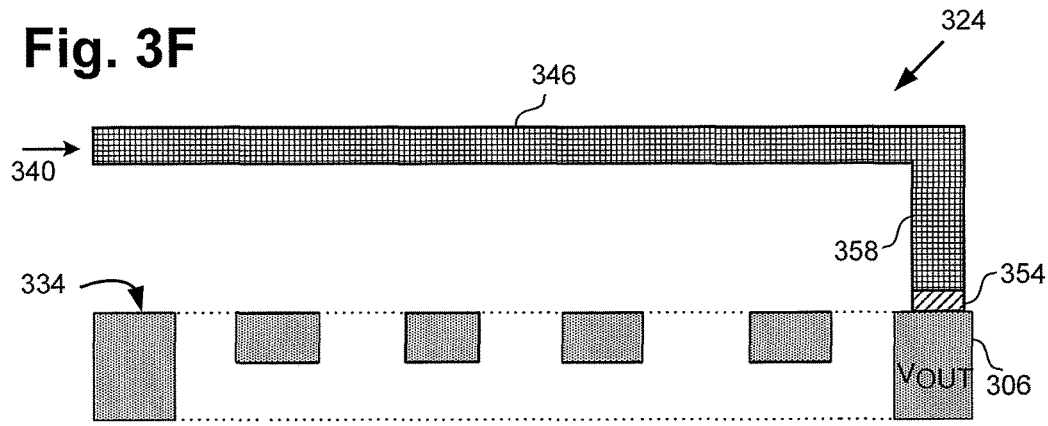
FIG. 3F shows a third cross-sectional view of the structure shown in FIG. 3C, in accordance with one implementation.
Figure 3G:
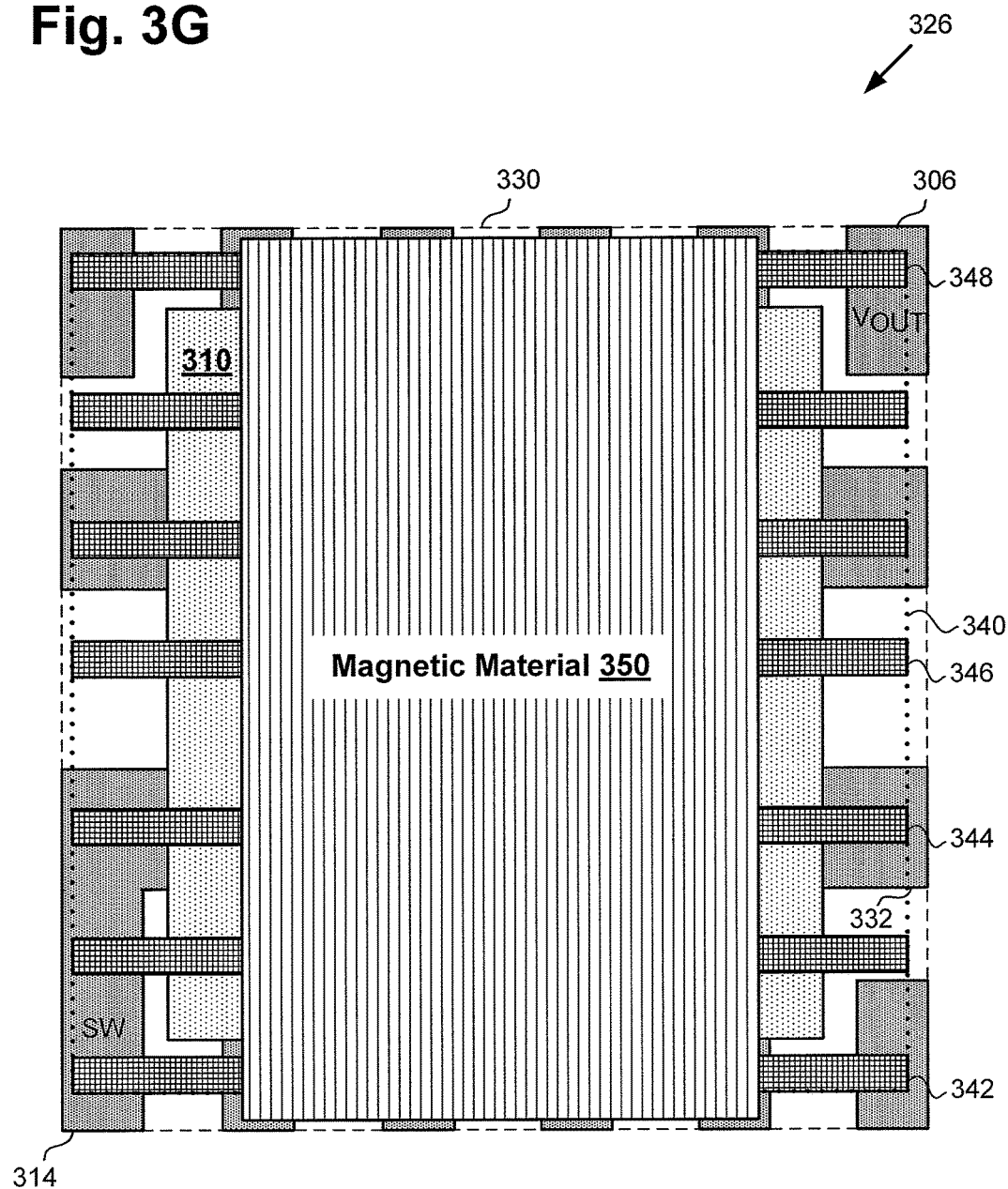
FIG. 3G shows a top view illustrating a result of performing a subsequent action according to the exemplary flowchart of FIG. 2, in accordance with one implementation.

With respect to FIGS. 3A, 3B, 3C, 3D, 3E, 3F, 3G, 3H, 3I, and 3J (hereinafter "FIGS. 3A-3J"), structures 322, 324, 326, and 328 shown in those figures illustrate the result of performing the method of flowchart 220, according to one implementation. For example, structure 322 in FIGS. 3A and 3B represents first patterned conductive carrier 330 having IC 310 flip chip mounted thereon (action 222). Structure 324 in FIGS. 3C, 3D, 3E, and 3F shows second patterned conductive carrier 340 situated over IC 310 (action 224). Structure 326 in FIG. 3G shows magnetic material 350 situated over second patterned conductive carrier 340 (action 226), and so forth.

Referring to flowchart 220, in FIG. 2, in combination with FIGS. 1 and 3A, flowchart 220 begins with flip chip mounting IC 310 on first patterned conductive carrier 330 (action 222). First patterned conductive carrier 330 may be a fully patterned conductive carrier for use as part of semiconductor package 102, in FIG. 1. As shown in FIG. 3A, first patterned conductive carrier 330 has multiple segments including segment 332, switch node segment 314, and output segment 306.

IC 310 and output segment 306 of first patterned conductive carrier 330 correspond respectively in general to IC 110 and output 106 of semiconductor package 102, in FIG. 1, and may share any of the characteristics attributed to those corresponding features in the present application. Thus, in one implementation, IC 310 may be a power converter switching stage IC including control FET 112, sync FET 116, switch node 114, and driver circuitry 118. Moreover, in such an implementation, switch node segment 314 of first patterned conductive carrier 330 may be electrically coupled to switch node 114 of IC 110/310, while output segment 306 of first patterned conductive carrier 330 may provide $V_{OUT}$ produced by power converter 100.

First patterned conductive carrier 330 may be formed of any conductive material having a suitably low electrical resistance. Examples of materials from which first patterned conductive carrier 330 may be formed include copper (Cu), aluminum (Al), or a conductive alloy. In one implementation, as noted above, first patterned conductive carrier 330 may be implemented using a portion of a semiconductor package lead frame.

Referring to FIG. 3B, FIG. 3B shows a cross-sectional view of structure 322 along perspective lines 3B-3B in FIG. 3A, according to one implementation. As shown in FIG. 3B, IC 310 is flip chip mounted on die receiving side 334 of first patterned conductive carrier 330 using electrical contact bodies including contact bodies 336a and 336b. As further shown in FIG. 3B, IC 310 is coupled to switch node segment 314 of first patterned conductive carrier 330 by contact bodies 336a, and is coupled to segment 332 of first patterned conductive carrier 330 by contact bodies 336b.

Contact bodies 336a and 336b may be any suitable electrically conductive bodies for flip chip mounting IC 310 on die receiving side 334 of first patterned conductive carrier 330. As a specific example, contact bodies 336a and 336b may be solder bodies, such as solder balls or bumps, for instance. It is noted that in implementations in which IC 310 is a power converter switching stage IC, such as IC 110, in FIG. 1, contact bodies 336a electrically couple switch node 114 of IC 110/310 to switch node segment 314 of first patterned conductive carrier 330.

Moving to structure 324 in FIG. 3C with ongoing reference to FIG. 2, flowchart 220 continues with situating second patterned conductive carrier 340 over IC 310 (action 224). As shown in FIG. 3C, second patterned conductive carrier 340 includes multiple fingers, including fingers 342, 344, 346, and 348. Like first conductive carrier 330, second patterned conductive carrier 340 may be formed of any conductive material having a suitably low electrical resistance. Examples of materials from which second patterned conductive carrier 340 may be formed include Cu, Al, or a conductive alloy. In one implementation, second patterned conductive carrier 340 may be implemented using a portion of a semiconductor package lead frame.

Referring to FIG. 3D, FIG. 3D shows a cross-sectional view of structure 324 along perspective lines 3D-3D in FIG. 3C, according to one implementation. As shown in FIG. 3D, in addition to having multiple fingers, such as finger 342, second patterned conductive carrier 340 may include legs, such as first leg 352. First leg 352 may be a portion of second patterned conductive carrier 340 that is oriented substantially perpendicular to finger 342, for example. As further shown in FIG. 3D, first leg 352 of second patterned conductive carrier 340 adjoins finger 342 and is concurrently attached to switch node segment 314 of first patterned conductive carrier 330 by electrically conductive bonding material 354.

Electrically conductive bonding material 354 may be any suitable substance for use as an electrically conductive adhesive. For example, electrically conductive bonding material 354 may be a conductive epoxy, solder, a conductive sintered material, or a diffusion bonded material. Thus, according to the implementation shown in FIG. 3D, first leg 352 and finger 342 of second patterned conductive carrier 340 are electrically coupled to switch node segment 314 of first patterned conductive carrier 330.

Referring to FIG. 3E, FIG. 3E shows a cross-sectional view of structure 324 along perspective lines 3E-3E in FIG. 3C, according to one implementation. As shown in FIG. 3E, finger 344 of second patterned conductive carrier 340 is situated over IC 310. However, in contrast to finger 342 of second patterned conductive carrier 340, finger 344 is not connected to a leg corresponding to first leg 352 in FIG. 3D. It is noted that, like finger 344, shown in FIG. 3E, finger 346 and all other fingers of second patterned conductive carrier 340 situated between finger 342 and finger 348 are not connected to legs such as first leg 352 in FIG. 3D.

Referring now to FIG. 3F, FIG. 3F shows a cross-sectional view of structure 324 along perspective lines 3F-3F in FIG. 3C, according to one implementation. As shown in FIG. 3F, like finger 342 in FIG. 3D, finger 348 of second patterned conductive carrier 340 is connected to a leg of second patterned conductive carrier 340, i.e., second leg 358. Moreover, and analogously to first leg 352, second leg 358 may be a portion of second patterned conductive carrier 340 that is oriented substantially perpendicular to finger 348. As further shown in FIG. 3F, in addition to being adjoined with finger 348, second leg 358 is attached to output segment 306 of first patterned conductive carrier by electrically conductive bonding material 354.

Thus, according to the implementation shown in FIGS. 3C, 3D, 3E, and 3F, second patterned conductive carrier 340 is situated over IC 310, includes multiple fingers, such as fingers 342, 344, 346, and 348, and includes first and second legs 352 and 356. In addition, second patterned conductive carrier 340 is electrically coupled to switch node segment 314 of first patterned conductive carrier 330 by first leg 352 and electrically conductive bonding material 354. Second patterned conductive carrier 340 is further electrically coupled to output segment 306 of first patterned conductive carrier 330 by second leg 358 of second patterned conductive carrier 340 and electrically conductive bonding material 354.

Moving to structure 326 in FIG. 3G with further reference to FIG. 2, flowchart 220 continues with situating magnetic material 350 over second patterned conductive carrier 340 (action 226). Magnetic material 350 may be any material suitable for use as an inductor core. For example, magnetic material 350 may take the form of a magnetic core, such as a high stability ferrite core of output inductor 104, in FIG. 1.

Figure 3H:
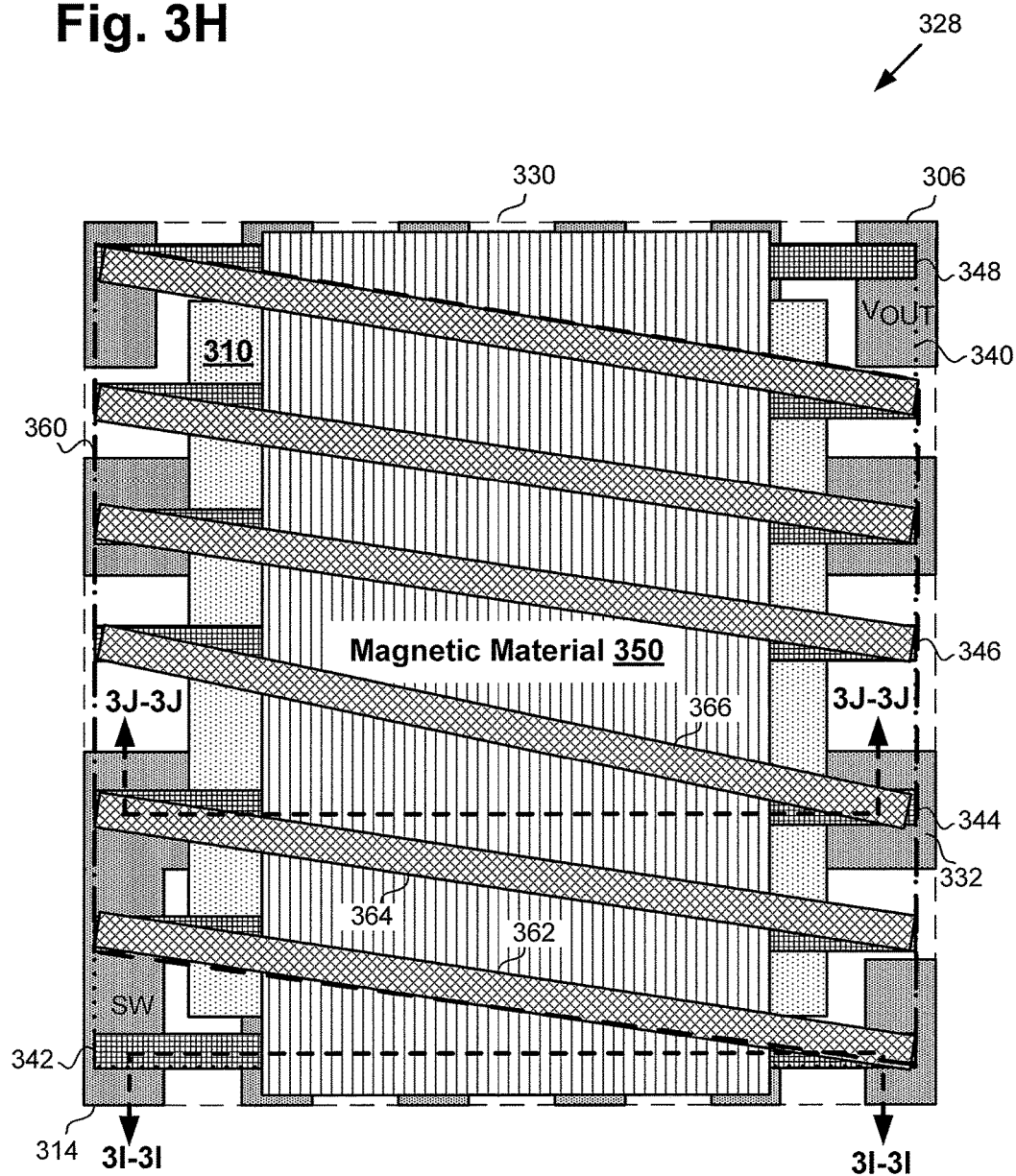
FIG. 3H shows a top view illustrating a result of performing a final action according to the exemplary flowchart of FIG. 2, in accordance with one implementation.

Continuing to structure 328 in FIG. 3H, flowchart 220 can conclude with situating third patterned conductive carrier 360 over magnetic material 350 (action 228). As shown in FIG. 3H, third patterned conductive carrier 360 may be a fully patterned conductive carrier having multiple oblique fingers including oblique fingers 362, 364, and 366.

Like first patterned conductive carrier 330 and second patterned conductive carrier 340, third patterned conductive carrier 360 may be formed of any conductive material having a suitably low electrical resistance. Examples of materials from which third patterned conductive carrier 360 may be formed include Cu, aluminum Al, or a conductive alloy. In one implementation, third patterned conductive carrier 360 may be implemented using a portion of a semiconductor package lead frame. In other words, in various implementations, any, all, or any combination of first patterned conductive carrier 330, second patterned conductive carrier 340, and third patterned conductive carrier 360 may be implemented using respective semiconductor package lead frames.

Figure 3I:
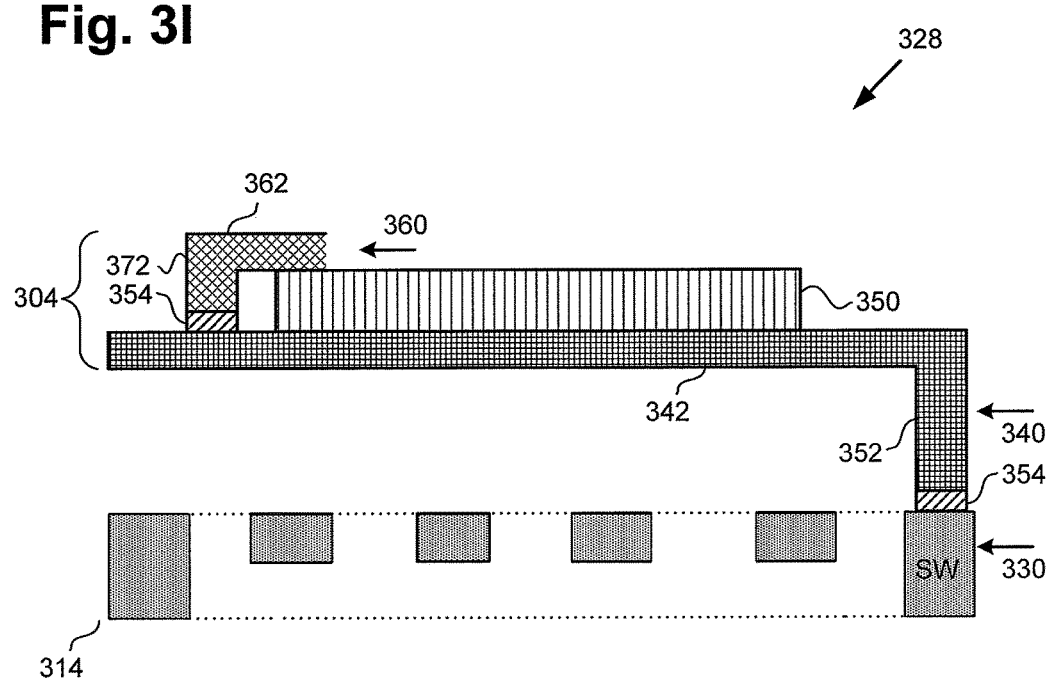
FIG. 3I shows a first cross-sectional view of the structure shown in FIG. 3H, in accordance with one implementation.

Referring to FIG. 3I, FIG. 3I shows a cross-sectional view of structure 328 along perspective lines 3I-3I in FIG. 3H, according to one implementation. As shown in FIG. 3I, in addition to having multiple oblique fingers, such as oblique finger 362, third patterned conductive carrier 360 also includes multiple legs, such as leg 372. Leg 372 may be a portion of third patterned conductive carrier 360 that is oriented substantially perpendicular to oblique finger 362. It is noted that oblique finger 362 is only partially shown in FIG. 3I because oblique finger 362 would be only partially visible from the perspective corresponding to perspective lines 3I-3I in FIG. 3H.

As further shown in FIG. 3I, leg 372 of third patterned conductive carrier 360 adjoins oblique finger 362 and is concurrently attached to finger 342 of second patterned conductive carrier 340 by electrically conductive bonding material 354. Thus, according to the implementation shown in FIG. 3I, leg 372 and oblique finger 362 of third patterned conductive carrier 360 are electrically coupled to second patterned conductive carrier 340.

As a result, and as described in greater detail below, second patterned conductive carrier 340 and third patterned conductive carrier 360 are electrically coupled so as to provide windings for vertically integrated inductor 304. Inductor 304 corresponds in general to output inductor 104, in FIG. 1, and may share any of the characteristics attributed to that corresponding feature in the present application. That is to say, in one implementation, inductor 304 may be an output inductor of a power converter, such as power converter 100, in FIG. 1.

Figure 3J:
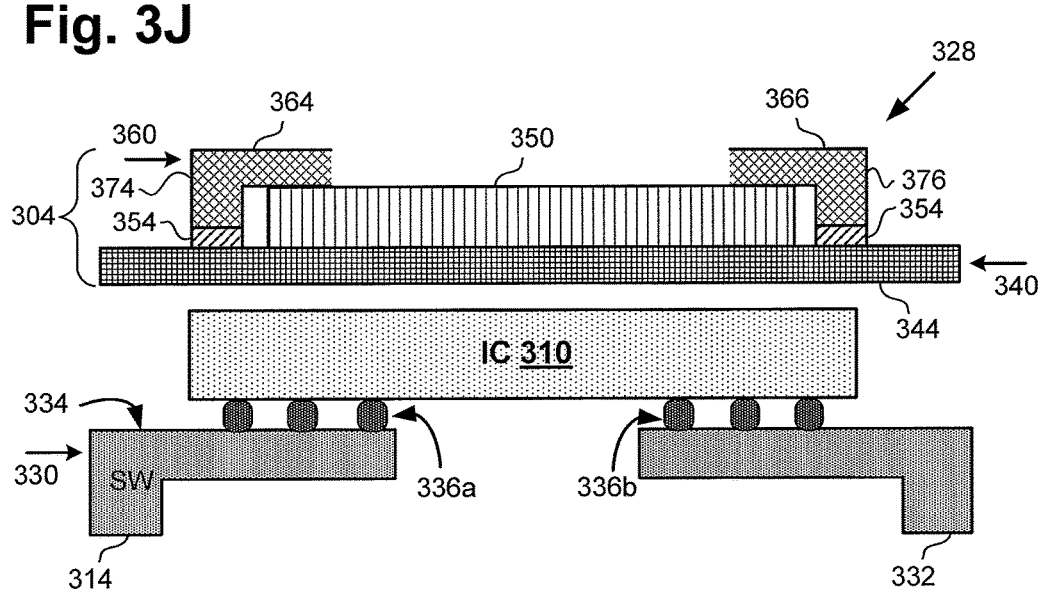
FIG. 3J shows a second cross-sectional view of the structure shown in FIG. 3H, in accordance with one implementation.

Referring now to FIG. 3J, FIG. 3J shows a cross-sectional view of structure 324 along perspective lines 3J-3J in FIG. 3H, according to one implementation. As shown in FIG. 3J, each of oblique finger 364 and oblique finger 366 of third patterned conductive carrier 360 partially overlies finger 344 of second patterned conductive carrier 340. Like oblique finger 362, each of oblique fingers 364 and 366 of third patterned conductive carrier 360 is connected to two legs of third patterned conductive carrier 360. For example, reference to FIGS. 3H and 3J in combination discloses that oblique finger 366 of third patterned conductive carrier 360 is electrically coupled to finger 344 of second patterned conductive carrier 340 by leg 376 of third patterned conductive carrier 360 and electrically conductive bonding material 354. Oblique finger 366 is further electrically coupled to finger 346, which neighbors finger 344, by another leg 376 (not visible in FIG. 3J) and electrically conductive bonding material 354.

Analogously, reference to FIGS. 3H and 3J in combination discloses that oblique finger 364 of third patterned conductive carrier 360 is electrically coupled to finger 344 of second patterned conductive carrier 340 by leg 374 of third patterned conductive carrier 360 and electrically conductive bonding material 354. Oblique finger 364 is further electrically coupled to a finger of second patterned conductive carrier 340 situated between and neighboring each of fingers 342 and 344 by another leg 374 (not visible in FIG. 3J) and electrically conductive bonding material 354. Legs 374 and 376 may be portions of third patterned conductive carrier 360 that are oriented substantially perpendicular to and adjoin respective oblique fingers 364 and 366.

Thus, according to the implementation shown in FIGS. 3H, 3I, and 3J, each oblique finger of third conductive carrier 360 is coupled to and forms an electrically conductive bridge between neighboring fingers of second patterned conductive carrier 360. As a result, the fingers of second patterned conductive carrier 340 and the oblique fingers of third patterned conductive carrier 360 are electrically coupled to form a continuous winding of output inductor 304 that surrounds magnetic material 350 from finger 342 to finger 348. Consequently, second patterned conductive carrier 340 and third patterned conductive carrier 360 are coupled between switch node segment 314 of first patterned conductive carrier 330 and output segment 306 of first patterned conductive carrier 330.

Figure 4:
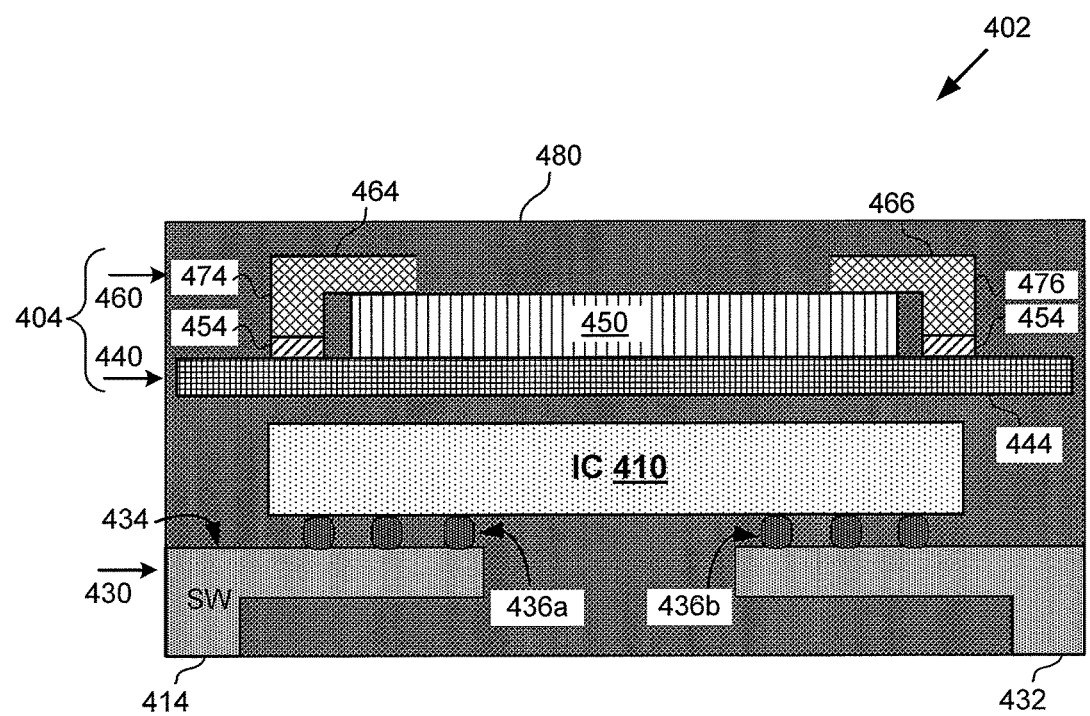
FIG. 4 shows a cross-sectional view of a semiconductor package including an IC and vertically integrated inductor, according to one implementation.

Moving to FIG. 4, FIG. 4 shows a cross-sectional view of semiconductor package 402 including IC 410 and vertically integrated inductor 404, according to one implementation. It is noted that semiconductor package 402 corresponds in general to semiconductor package 102, in FIG. 1, and may share any of the characteristics attributed to that corresponding feature in the present application. It is further noted that the features shown to be contained by semiconductor package 402 correspond in general to structure 328, in FIGS. 3H, 3I, and 3J viewed from a perspective corresponding to perspective lines 3J-3J, in FIG. 3H.

Semiconductor package 402 includes IC 410 flip chip mounted on die receiving side 434 of switch node segment 414 and segment 432 of first patterned conductive carrier 430 by contact bodies 436a and 436b. As shown in FIG. 4, semiconductor package 402 also includes second patterned conductive carrier 440 having finger 444 situated over IC 410 and magnetic material 450 situated over second patterned conductive carrier 440. As further shown in FIG. 4, semiconductor package 402 includes third patterned conductive carrier 460 having oblique fingers 464 and 466, and legs 474 and 476, situated over magnetic material 450. Also shown in FIG. 4 are electrically conductive bonding material 454 and packaging encapsulant 480.

IC 410, contact bodies 436a and 436b, and first patterned conductive carrier 430 correspond respectively in general to IC 310, contact bodies 336a and 336b, and first patterned conductive carrier 330, in FIGS. 3A-3J, and may share any of the characteristics attributed to those corresponding features, above. In addition to corresponding to IC 310, IC 410 also corresponds in general to IC 110, in FIG. 1, and may share any of the characteristics attributed to that corresponding feature, above. That is to say, in one implementation, IC 410 may be a switching stage IC for use in power converter 100.

Second patterned conductive carrier 440, magnetic material 450, third patterned conductive carrier 460, and electrically conductive bonding material 454 correspond respectively in general to second patterned conductive carrier 340, magnetic material 350, third patterned conductive carrier 360, and electrically conductive bonding material 354, and may share any of the characteristics attributed to those corresponding features, above. It is noted that packaging encapsulant 480 may be any suitable dielectric molding compound or encapsulation material typically used in semiconductor packaging.

As discussed above by reference to FIGS. 3H, 3I, and 3J, the fingers of second patterned conductive carrier 440 and the oblique fingers of third patterned conductive carrier 460 are electrically coupled to form a continuous winding of output inductor 404 that surrounds magnetic material 450 from a finger of second patterned conductive carrier 440 corresponding to finger 342 in FIG. 3H, to a finger of second patterned conductive carrier 440 corresponding to finger 348 in FIG. 3H. Consequently, second patterned conductive carrier 440 and third patterned conductive carrier 460 are coupled between switch node segment 414 of first patterned conductive carrier 430 and an output segment of first patterned conductive carrier 430 corresponding to output segment 306 in FIG. 3H. As a result, output inductor 404 is vertically integrated into semiconductor package 402 by having magnetic material 450 providing the magnetic core of output inductor 404 surrounded by inductor windings provided by second patterned conductive carrier 440 and third patterned conductive carrier 460.

Figure 5:
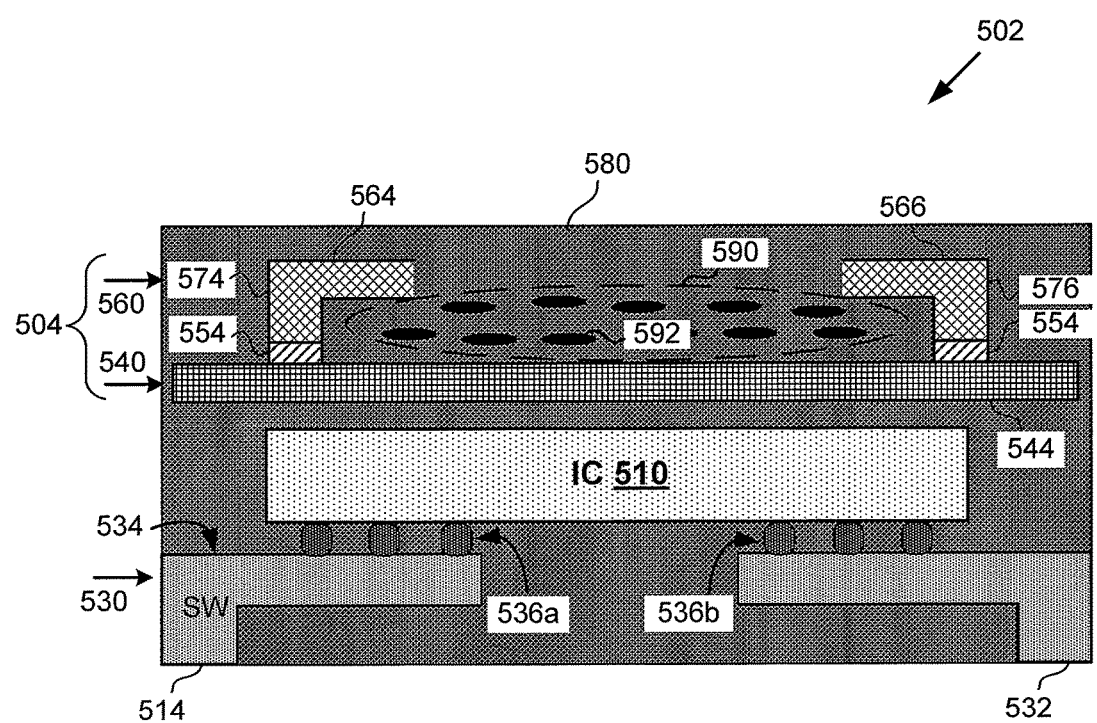
FIG. 5 shows a cross-sectional view of a semiconductor package including an IC and vertically integrated inductor, according to another implementation.

Continuing to FIG. 5, FIG. 5 shows a cross-sectional view of semiconductor package 502 including IC 510 and vertically integrated inductor 504, according to another implementation. It is noted that semiconductor package 502 corresponds in general to semiconductor package 102/402, in FIG. 1/4, and may share any of the characteristics attributed to that corresponding feature in the present application. It is further noted that, with the exception of magnetic material 590, the features shown to be contained by semiconductor package 502 correspond in general to structure 328, in FIGS. 3H, 3I, and 3J viewed from a perspective corresponding to perspective lines 3J-3J, in FIG. 3H.

Semiconductor package 502 includes IC 510 flip chip mounted on die receiving side 534 of switch node segment 514 and segment 532 of first patterned conductive carrier 530 by contact bodies 536a and 536b. As shown in FIG. 5, semiconductor package 502 also includes second patterned conductive carrier 540 having finger 544 situated over IC 510 and magnetic material 590 situated over second patterned conductive carrier 540. As further shown in FIG. 5, semiconductor package 502 includes third patterned conductive carrier 560 having oblique fingers 564 and 566, and legs 574 and 576, situated over magnetic material 590. Also shown in FIG. 5 are electrically conductive bonding material 554 and packaging encapsulant 580.

IC 510, contact bodies 536a and 536b, and first patterned conductive carrier 530 correspond respectively in general to IC 310, contact bodies 336a and 336b, and first patterned conductive carrier 330, in FIGS. 3A-3J, and may share any of the characteristics attributed to those corresponding features, above. In addition to corresponding to IC 310, IC 510 also corresponds in general to IC 110, in FIG. 1, and may share any of the characteristics attributed to that corresponding feature, above. That is to say, in one implementation, IC 510 may be a switching stage IC for use in power converter 100.

Second patterned conductive carrier 540, third patterned conductive carrier 560, and electrically conductive bonding material 554 correspond respectively in general to second patterned conductive carrier 340, third patterned conductive carrier 360, and electrically conductive bonding material 354, and may share any of the characteristics attributed to those corresponding features, above. Packaging encapsulant 580 may be any suitable dielectric molding compound or encapsulation material typically used in semiconductor packaging.

Semiconductor package 502 differs from semiconductor package 402 in that according to the present implementation, magnetic material 590 of output inductor 504 is provided by packaging encapsulant 580, which may be a molding compound impregnated with magnetic particles 592, for example. Magnetic particles 592 may be ferrite particles, for instance, which may be dispersed in packaging encapsulant 580 between finger 544 of second patterned conductive carrier 540 and oblique fingers 564 and 566 of third patterned conductive carrier 560, as well as between all other fingers of second patterned conductive carrier 540 and oblique fingers of third patterned conductive carrier 560 providing windings of output inductor 504.

As discussed above by reference to FIGS. 3H, 3I, and 3J, the fingers of second patterned conductive carrier 540 and the oblique fingers of third patterned conductive carrier 560 are electrically coupled to form a continuous winding of output inductor 504 that surrounds magnetic material 590 from a finger of second patterned conductive carrier 540 corresponding to finger 342 in FIG. 3H, to a finger of second patterned conductive carrier 540 corresponding to finger 348 in FIG. 3H. Consequently, second patterned conductive carrier 540 and third patterned conductive carrier 560 are coupled between switch node segment 514 of first patterned conductive carrier 530 and an output segment of first patterned conductive carrier 530 corresponding to output segment 306 in FIG. 3H. As a result, output inductor 504 is vertically integrated into semiconductor package 502 by having magnetic material 590 of output inductor 504 surrounded by inductor windings provided by second patterned conductive carrier 540 and third patterned conductive carrier 560.

Thus, the present application discloses a semiconductor package including a flip chip mounted IC with vertically integrated inductor that provides a highly compact design. In one implementation, for example, the disclosed semiconductor package may provide packaging for a power converter switching stage IC suitable for use as a voltage regulator. By coupling fingers of a second patterned conductive carrier situated over an IC flip chip mounted to a first patterned conductive carrier, to oblique fingers of a third patterned conductive carrier, the implementations disclosed herein enable use of the second and third patterned conductive carriers to provide windings of an output inductor having its magnetic core situated between the second and third patterned conductive carriers. Consequently, the packaging solutions disclosed herein advantageously result in a substantial reduction in the printed circuit board surface area required to implement an IC in combination with an inductor.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A semiconductor package comprising:
a first patterned conductive carrier:
an integrated circuit (IC) flip chip mounted on said first patterned conductive carrier such that a node of said IC is electrically and directly coupled to a node segment of said first patterned conductive carrier;
a second patterned conductive carrier situated over said IC such that a leg of second patterned conductive carrier is electrically coupled to said node segment of said first patterned conductive carrier;
a magnetic material situated over said second patterned conductive carrier;
a third patterned conductive carrier situated over said magnetic material; and encapsulant material in contact with each one of said IC, said first patterned conductive carrier, said second patterned conductive carrier, said magnetic material, and said third patterned conductive carrier;
said second patterned conductive carrier and said third patterned conductive carrier being mechanically coupled at ends external said magnetic material so as to form windings that extend around a perimeter edge of said magnetic material of an integrated inductor in said semiconductor package, wherein said IC is arranged between said first patterned conductive carrier and said second patterned conductive carrier.

2. The semiconductor package of claim 1, wherein said magnetic material comprises a magnetic core.

3. The semiconductor package of claim 1, wherein said magnetic material comprises a portion of said encapsulant material that is impregnated with magnetic particles.

4. The semiconductor package of claim 1, wherein said IC comprises a power converter switching stage, said integrated inductor being implemented as an output inductor of said power converter switching stage.

5. The semiconductor package of claim 4, wherein said node of said IC is a switch node of said power converter switching stage and wherein said node segment is a switch node segment of said first patterned conductive carrier.

6. The semiconductor package of claim 5, wherein said second patterned conductive carrier and said third patterned conductive carrier are coupled between said switch node segment and a power converter output segment of said first patterned conductive carrier.

7. The semiconductor package of claim 5, wherein said power converter switching stage includes a control transistor coupled to a sync transistor at said switch node, and wherein said control and sync transistors comprise silicon transistors.

8. The semiconductor package of claim 5, wherein said power converter switching stage includes a control transistor coupled to a sync transistor at said switch node, and wherein said control and sync transistors comprise group III-V transistors.

9. The semiconductor package of claim 1, wherein said third patterned conductive carrier comprises a portion of a lead frame.

10. The semiconductor package of claim 1, wherein said second patterned conductive carrier and said third patterned conductive carrier comprise portions of a lead frame.

11. The semiconductor package of claim 1, wherein said third patterned conductive carrier includes end segments that extend, along a length of but external to said magnetic material, to said second patterned conductive carrier so that said second patterned conductive carrier and said third patterned conductive carrier are mechanically coupled at ends external said magnetic material so as to form windings that extend around the perimeter edge of said magnetic material of said integrated inductor in said semiconductor package.

12. The semiconductor package of claim 1, wherein said node of said IC is electrically and directly coupled to said node segment of said first patterned conductive carrier by contact bodies.

* * * * *